United States Patent
Chu et al.

(10) Patent No.: US 10,825,787 B2
(45) Date of Patent: Nov. 3, 2020

(54) ELECTRONIC ELEMENT AND ELECTRONIC DEVICE COMPRISING THE SAME

(71) Applicant: InnoLux Corporation, Miao-Li County (TW)

(72) Inventors: Wei-Cheng Chu, Miao-Li County (TW); Ming-Fu Jiang, Miao-Li County (TW); Chia-Cheng Liu, Miao-Li County (TW); Tong-Jung Wang, Miao-Li County (TW)

(73) Assignee: Innolux Corporation, Chu-Nan (TW)

( * ) Notice: Subject to any disclaimer, the term of this patent is extended or adjusted under 35 U.S.C. 154(b) by 66 days.

(21) Appl. No.: 16/148,253

(22) Filed: Oct. 1, 2018

(65) Prior Publication Data

US 2019/0148320 A1 May 16, 2019

(30) Foreign Application Priority Data

Nov. 16, 2017 (CN) ............ 2017 1 1141362

(51) Int. Cl.
*H01L 23/00* (2006.01)
*H01L 25/10* (2006.01)
(Continued)

(52) U.S. Cl.
CPC .............. *H01L 24/05* (2013.01); *H01L 24/13* (2013.01); *H01L 24/29* (2013.01); *H01L 24/83* (2013.01); *H01L 25/105* (2013.01); *H01L 25/18* (2013.01); *H01L 27/1244* (2013.01); *H01L 24/16* (2013.01); *H01L 24/27* (2013.01); *H01L 24/32* (2013.01); *H01L 24/73* (2013.01); *H01L 24/81* (2013.01); *H01L 24/92* (2013.01); (Continued)

(58) Field of Classification Search
CPC ....................................................... H01L 24/05
USPC ............................................................ 257/88
See application file for complete search history.

(56) References Cited

U.S. PATENT DOCUMENTS

2005/0040529 A1   2/2005   Lee
2015/0208511 A1*  7/2015   Ishimatsu ................ B32B 3/30
                                                        361/749

(Continued)

FOREIGN PATENT DOCUMENTS

CN   101188219 A   5/2008
CN   107078420 A   8/2017

*Primary Examiner* — Ajay Arora
(74) *Attorney, Agent, or Firm* — Muncy, Geissler, Olds & Lowe, P.C.

(57) ABSTRACT

A first electronic element is disclosed, which includes: a first substrate having a first surface; a first electrode pad disposed on the first surface, wherein the first electrode pad has a second surface away from the first substrate; and an insulating layer disposed on the first surface, wherein the insulating layer includes an opening, the opening is disposed correspondingly to the first electrode pad, and the opening overlaps the first electrode pad in a normal direction of the first surface, wherein the insulating layer has a third surface away from the first substrate, a distance between the third surface and the second surface in the normal direction of the first surface is defined as a first distance, and the first distance is greater than 0 μm and less than or equal to 14 μm. In addition, the disclosure further provides an electronic device including the first electronic element.

20 Claims, 13 Drawing Sheets

(51) Int. Cl.
    *H01L 25/18* (2006.01)
    *H01L 27/12* (2006.01)
(52) U.S. Cl.
    CPC ........ *H01L 27/124* (2013.01); *H01L 27/1255* (2013.01); *H01L 2224/02185* (2013.01); *H01L 2224/0401* (2013.01); *H01L 2224/04026* (2013.01); *H01L 2224/05007* (2013.01); *H01L 2224/0568* (2013.01); *H01L 2224/05082* (2013.01); *H01L 2224/05111* (2013.01); *H01L 2224/05124* (2013.01); *H01L 2224/05147* (2013.01); *H01L 2224/05573* (2013.01); *H01L 2224/05666* (2013.01); *H01L 2224/05686* (2013.01); *H01L 2224/11332* (2013.01); *H01L 2224/13013* (2013.01); *H01L 2224/13022* (2013.01); *H01L 2224/1329* (2013.01); *H01L 2224/13082* (2013.01); *H01L 2224/13311* (2013.01); *H01L 2224/13339* (2013.01); *H01L 2224/13344* (2013.01); *H01L 2224/13347* (2013.01); *H01L 2224/13355* (2013.01); *H01L 2224/13364* (2013.01); *H01L 2224/13499* (2013.01); *H01L 2224/16014* (2013.01); *H01L 2224/16145* (2013.01); *H01L 2224/16147* (2013.01); *H01L 2224/27332* (2013.01); *H01L 2224/27436* (2013.01); *H01L 2224/29011* (2013.01); *H01L 2224/2919* (2013.01); *H01L 2224/2929* (2013.01); *H01L 2224/29035* (2013.01); *H01L 2224/29076* (2013.01); *H01L 2224/29082* (2013.01); *H01L 2224/29083* (2013.01); *H01L 2224/29311* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/29499* (2013.01); *H01L 2224/32145* (2013.01); *H01L 2224/73103* (2013.01); *H01L 2224/73204* (2013.01); *H01L 2224/8185* (2013.01); *H01L 2224/81191* (2013.01); *H01L 2224/81203* (2013.01); *H01L 2224/83101* (2013.01); *H01L 2224/83191* (2013.01); *H01L 2224/83204* (2013.01); *H01L 2224/83851* (2013.01); *H01L 2224/9211* (2013.01); *H01L 2225/1058* (2013.01); *H01L 2924/1426* (2013.01)

(56)  References Cited

U.S. PATENT DOCUMENTS

2015/0270251 A1* 9/2015 Nagami ................ H01L 33/08
                                                                 257/758
2019/0295974 A1* 9/2019 Muraoka ................ G09F 9/00

* cited by examiner

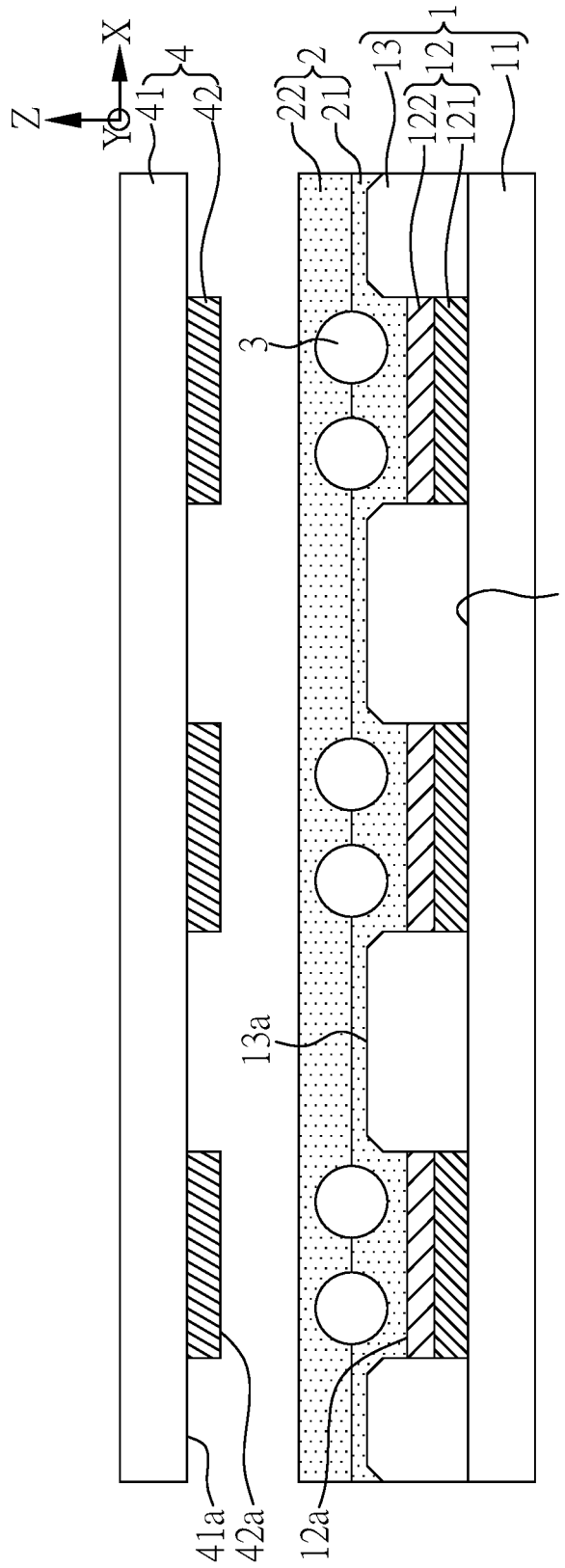
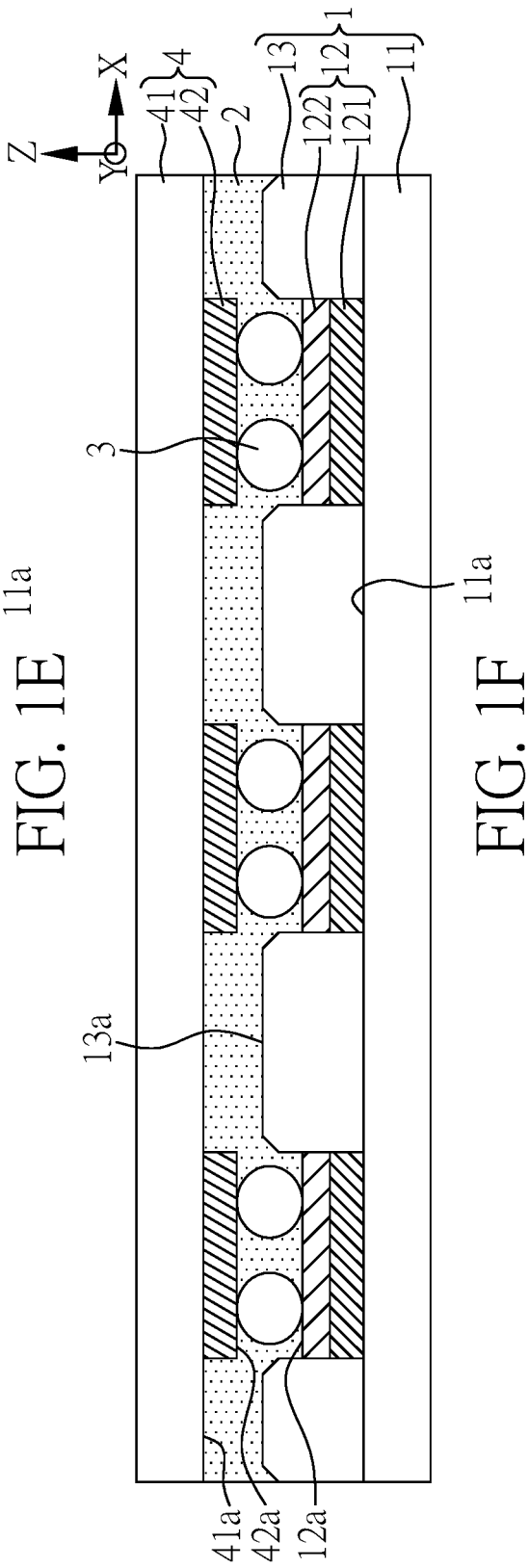
FIG. 1E
FIG. 1F

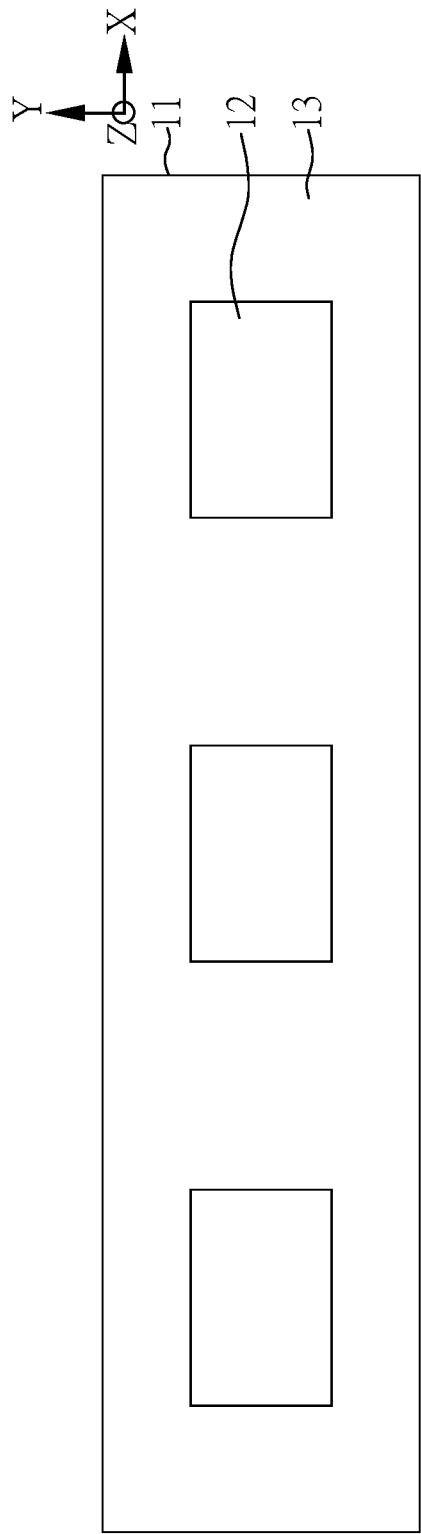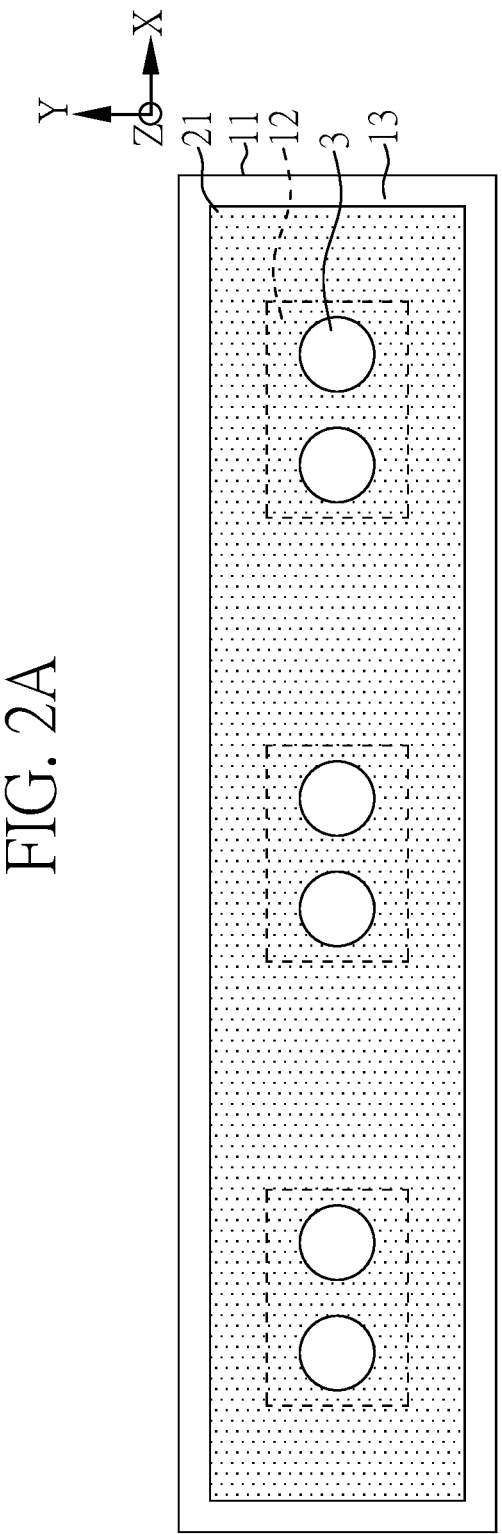

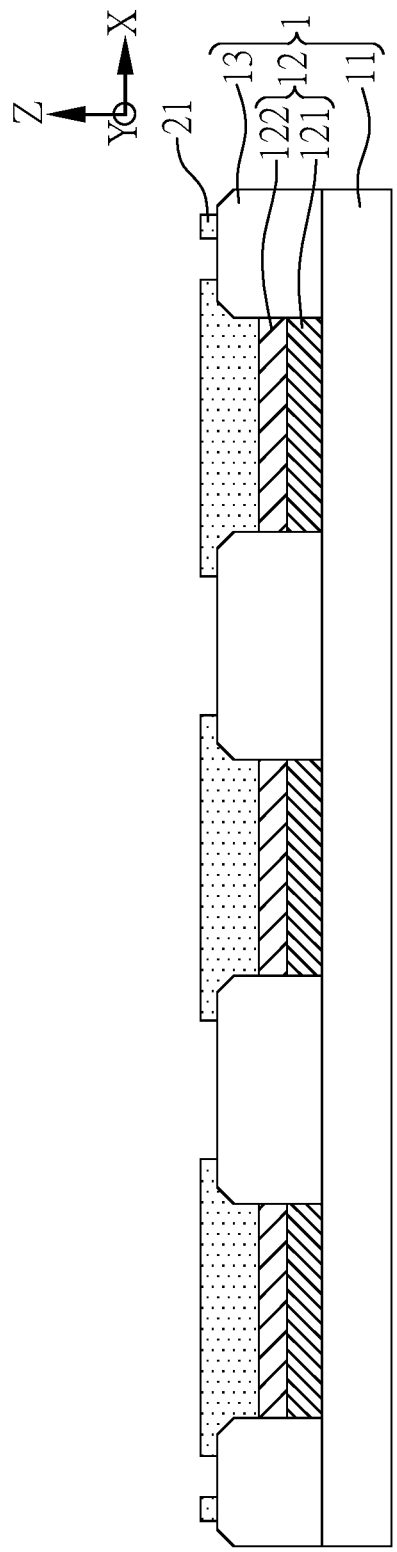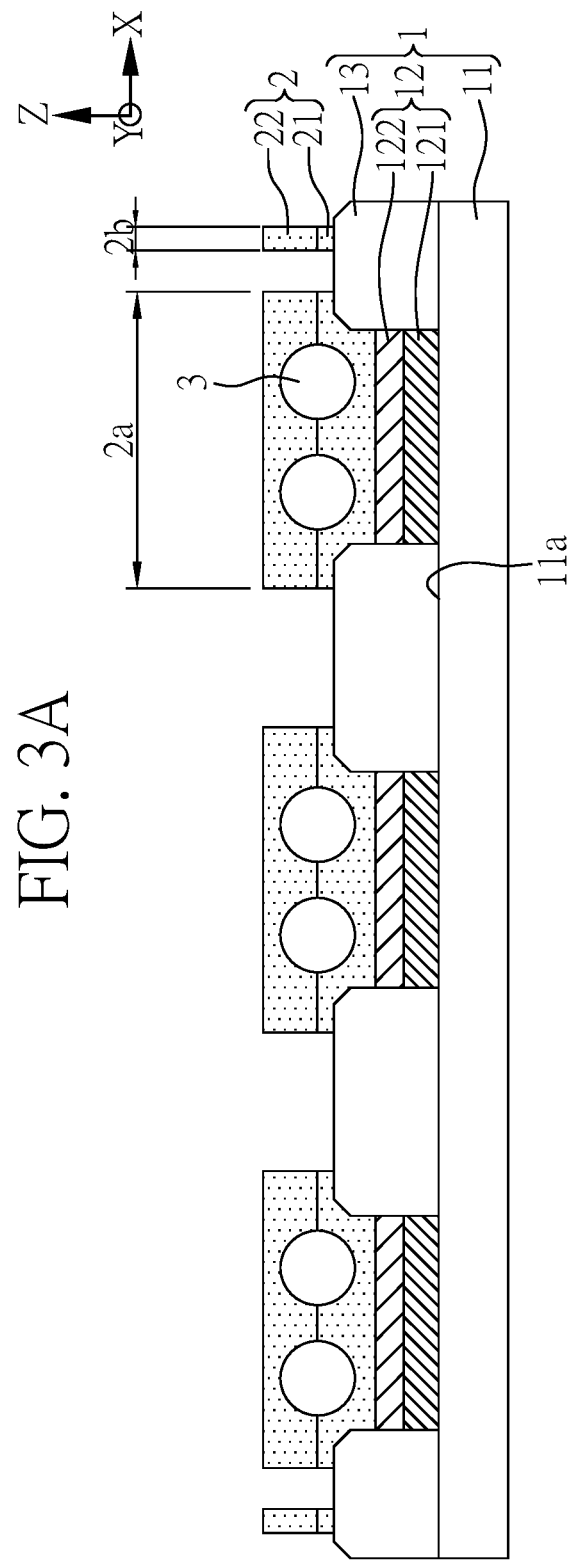
FIG. 3A
FIG. 3B

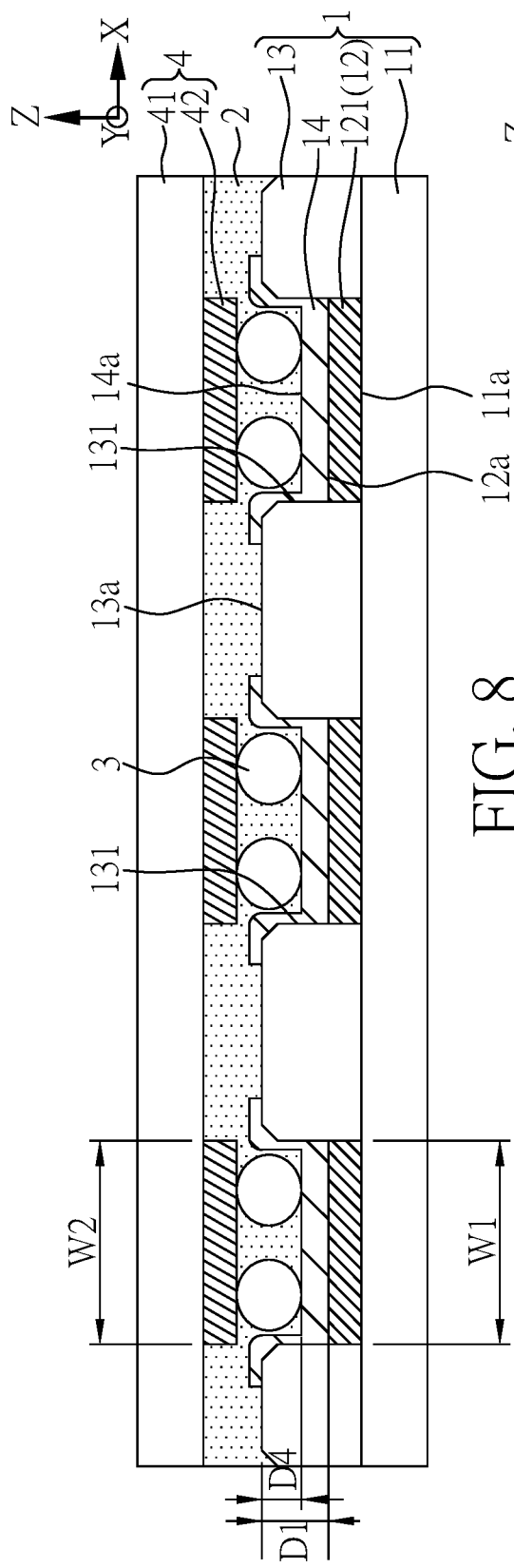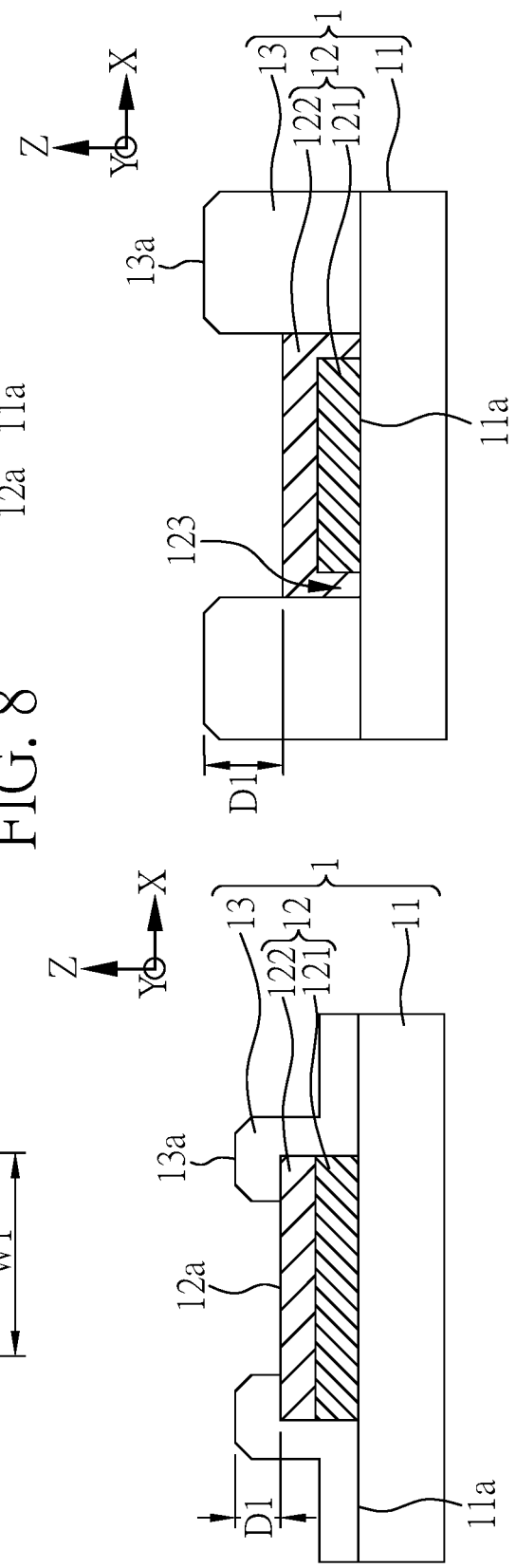

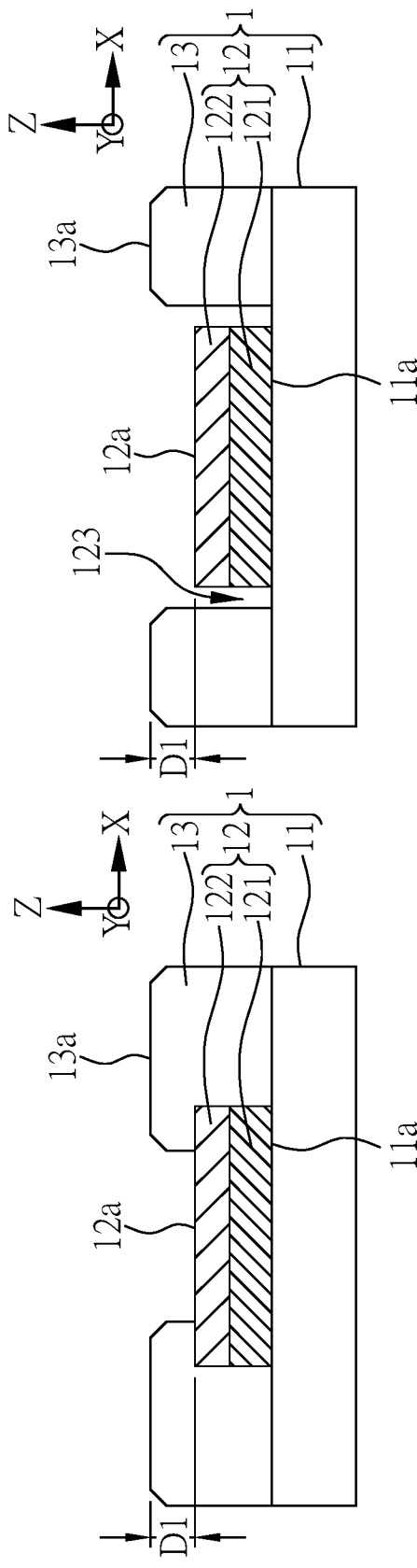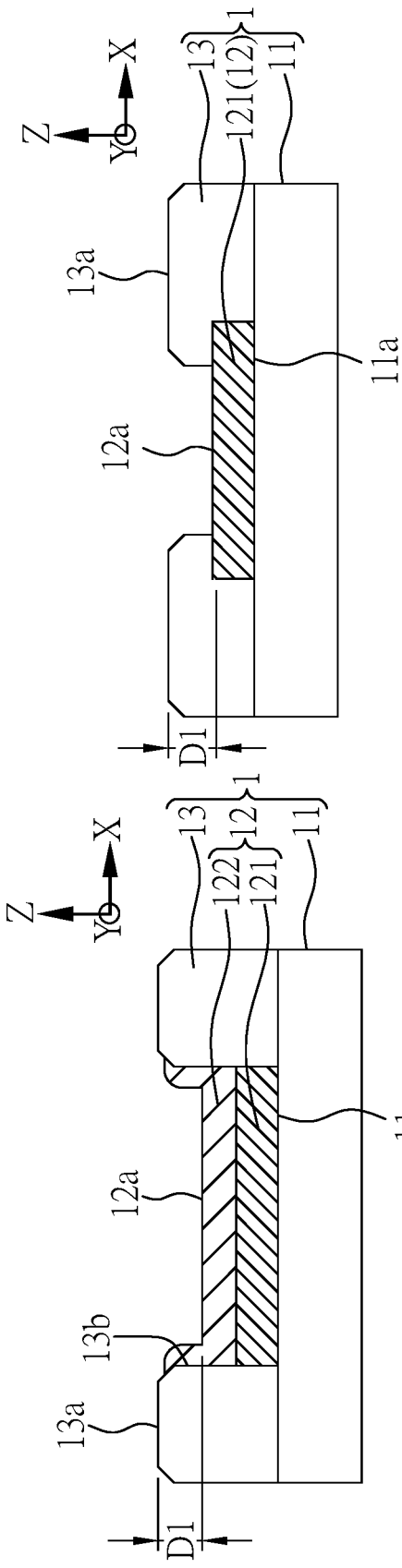

ELECTRONIC ELEMENT AND ELECTRONIC DEVICE COMPRISING THE SAME

CROSS REFERENCE TO RELATED APPLICATION

This application claims the benefits of the Chinese Patent Application Serial Number 201711141362.2, filed on Nov. 16, 2017, the subject matter of which is incorporated herein by reference.

BACKGROUND

1. Field

The present disclosure relates to a first electronic element and an electronic device comprising the same. More specifically, the present disclosure relates to a first electronic element with a specific structure and an electronic device comprising the same.

2. Description of Related Art

With the continuous advancement of technologies related to displays, all the display panels are now developed toward compactness, thinness, or lightness. This trend makes thin displays, such as liquid crystal displays, organic light emitting diode displays and inorganic light emitting diode displays as the mainstream display devices on the market. Applications of thin displays are numerous. Most electronic products for daily use, such as mobile phones, notebook computers, video cameras, still cameras, music displays, mobile navigators, and TV sets, employ such display panels.

In the display device, electronic elements are usually adhered to or electrically connect to substrates. If the electronic elements have bumps, after the lamination of the electronic elements and the substrate by, for example, a high temperature lamination, height difference may be occurred at two ends or different regions of the electronic elements between the bumps. This height difference may easily cause the deforming of the electronic elements, so the electronic elements cannot adhere to the substrates well, resulting in the conductivity or yield of the display device reduced.

Therefore, it is desirable to improve the structure of the electronic element to improve the deforming problem of the electronic elements after the high temperature lamination or increase the yield of the display device.

SUMMARY

The present disclosure provides a first electronic element, which comprises: a first substrate having a first surface; a first electrode pad disposed on the first surface, wherein the first electrode pad has a second surface away from the first substrate; and an insulating layer disposed on the first surface, wherein the insulating layer comprises an opening, the opening is disposed correspondingly to the first electrode pad, and the opening overlaps the first electrode pad in a normal direction of the first surface, wherein the insulating layer has a third surface away from the first substrate, a distance between the third surface and the second surface in the normal direction of the first surface is defined as a first distance, and the first distance is greater than 0 μm and less than or equal to 14 μm.

In addition, the present disclosure further provides an electronic device, which comprises: the aforesaid first electronic element; a second electronic element comprising: a second substrate having a fourth surface; and a second electrode pad disposed on the fourth surface, wherein the second electrode pad has a fifth surface away from the second substrate, and the fifth surface corresponds to and faces to the second surface of the first electrode pad; and a conductive element disposed between the first electrode pad and the second electrode pad, wherein the first electrode pad electrically connects to the second electrode pad via the conductive element.

Other novel features of the disclosure will become more apparent from the following detailed description when taken in conjunction with the accompanying drawings.

BRIEF DESCRIPTION OF THE DRAWINGS

FIG. 1A to FIG. 1F are cross-sectional views showing a process for preparing an electronic device according to Embodiment 1 of the present disclosure.

FIG. 2A is a top view of FIG. 1A.

FIG. 2B is a top view of FIG. 1C.

FIG. 3A to FIG. 3C are cross-sectional views showing a process for preparing an electronic device according to Embodiment 2 of the present disclosure.

FIG. 8 is a cross-sectional view of an electronic device according to Embodiment 5 of the present disclosure.

FIG. 9 is a cross-sectional view of a first electronic element according to Embodiment 6 of the present disclosure.

FIG. 10 is a cross-sectional view of a first electronic element according to Embodiment 7 of the present disclosure.

FIG. 11 is a cross-sectional view of a first electronic element according to Embodiment 8 of the present disclosure.

FIG. 12 is a cross-sectional view of a first electronic element according to Embodiment 9 of the present disclosure.

FIG. 13 is a cross-sectional view of a first electronic element according to Embodiment 10 of the present disclosure.

FIG. 14 is a cross-sectional view of a first electronic element according to Embodiment 11 of the present disclosure.

DETAILED DESCRIPTION OF EMBODIMENT

The following embodiments when read with the accompanying drawings are made to clearly exhibit the above-mentioned and other technical contents, features and/or effects of the present disclosure. Through the exposition by means of the specific embodiments, people would further understand the technical means and effects the present disclosure adopts to achieve the above-indicated objectives.

Moreover, as the contents disclosed herein should be readily understood and can be implemented by a person skilled in the art, all equivalent changes or modifications which do not depart from the concept of the present disclosure should be encompassed by the appended claims.

Furthermore, the ordinals recited in the specification and the claims such as "first", "second" and so on are intended only to describe the elements claimed and imply or represent neither that the claimed elements have any proceeding ordinals, nor that sequence between one claimed element and another claimed element or between steps of a manufacturing method. The use of these ordinals is merely to differentiate one claimed element having a certain designation from another claimed element having the same designation.

Furthermore, the terms recited in the specification and the claims such as "above", "over", or "on" are intended not only directly contact with the other element, but also intended indirectly contact with the other element. Similarly, the terms recited in the specification and the claims such as "below", or "under" are intended not only directly contact with the other element but also intended indirectly contact with the other element.

Furthermore, the terms recited in the specification and the claims such as "connect" is intended not only directly connect with other element, but also intended indirectly connect and electrically connect with other element.

Furthermore, when a value is in a range from a first value to a second value, the value can be the first value, the second value, or another value between the first value and the second value.

In addition, the features in different embodiments of the present disclosure can be mixed to form another embodiment.

Embodiment 1

Figure 1A:
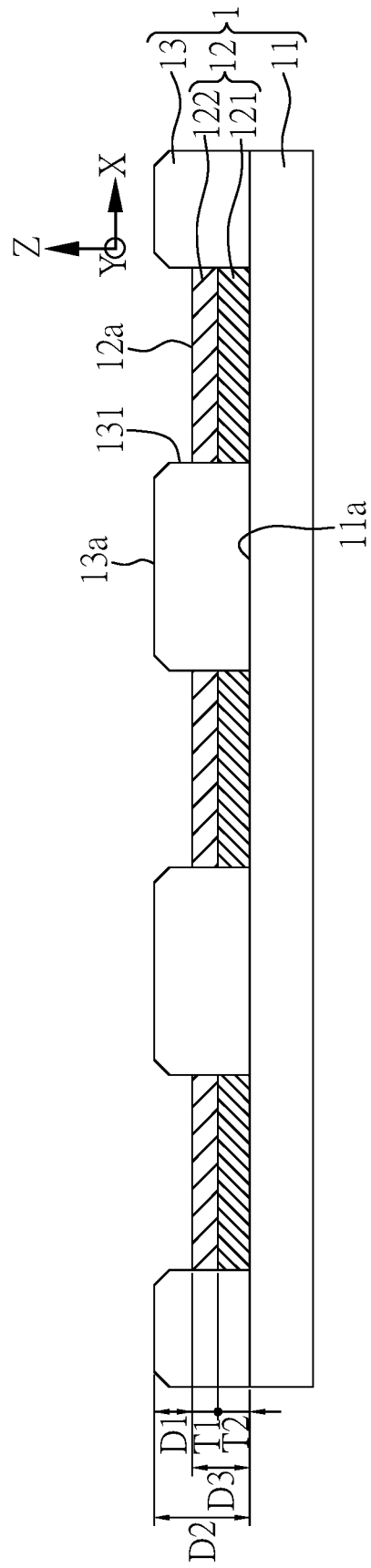

FIG. 1A to FIG. 1F are cross-sectional views showing a process for preparing an electronic device according the present embodiment. FIG. 2A to FIG. 2C are respectively top view of FIG. 1A, FIG. 1C and FIG. 1D. As shown in FIG. 1A and FIG. 2A, a first substrate 11 is firstly provided, and a first electrode layer 121 is formed on the first substrate 11. Next, an insulating layer 13 is formed on the first substrate 11. After patterning the insulating layer 13 to remove the insulating layer 13 corresponding to the first electrode layer 121, a second electrode layer 122 is formed on the first electrode layer 121, and the first electrode layer 121 and the second electrode layer 122 forms a first electrode pad 12. Thus, the first electronic element 1 of the present embodiment is obtained. In the present embodiment, the insulating layer 13 is formed in advance, and then the second electrode layer 122 is formed. In another embodiment of the present disclosure, the insulating layer 13 can be formed after forming the second electrode layer 122. The structural relationships between the insulating layer 13 and the first electrode layer 121 or between the insulting layer 13 and the second electrode layer 122 in the first electronic element 1 are illustrated hereinafter. In the present embodiment, the first electronic element 1 comprises: a first substrate 11 having a first surface 11a; a first electrode pad 12 disposed on the first surface 11a of the first substrate 11, wherein the first electrode pad 12 has a second surface 12a away from the first substrate 11; and an insulating layer 13 disposed on the first surface 11a of the first substrate 11, wherein the insulating layer 13 comprises an opening 131, the opening 131 is disposed correspondingly to the first electrode pad 12, and the opening 131 overlaps the first electrode pad 12 in a normal direction (Z) of the first surface 11a. The opening 131 also overlaps the second surface 12a in the normal direction (Z) of the first surface 11a. In other word, at least a part of the second surface 12a of the first electrode pad 12 is exposed from the opening 131. The region of the opening 131 of the insulating layer 13 is a region that the insulating layer 13 does not overlap the second surface 12a in the normal direction (Z) of the first surface 11a. From a top view of the first electronic element 1 (i.e. viewing from the normal direction (Z) of the first surface 11a), the outline of the opening 131 may be, but is not limited to, a rectangle with right angles, a rectangle with arc angles, a polygon, or any other suitable shape.

The first electronic element 1 may comprise a gate driver IC, a data driver IC, a timing controller IC (Tcon IC), but the present disclosure is not limited thereto.

The first substrate 11 may comprise, but is not limited to, a silicon wafer, a quartz substrate, a glass substrate (silicon dioxide), a sapphire substrate, a plastic substrate, or other suitable substrate. The material of the plastic substrate may comprise, but is not limited to, polyimide (PI), polyethylene terephthalate (PET), polycarbonate (PC), polypropylene (PP), or other plastic material. Before disposing the first electrode pad 12 on the first substrate 11, a transistor, a capacitor, a wiring or other element may be formed in advance to form an integrated circuit on the first substrate 11, and the formed integrated circuit can be electrically connect to other circuit via the first electrode pad 12 to achieve the purpose of signal transmittance. The insulating layer 13 may be formed by, for example, a wet coating process such as a spin coating process, a roll coating process, a blade coating process, a slide coating process, an extrusion coating process or a bar coating process; but the present disclosure is not limited thereto. In addition, the material of the insulating layer 13 may be a moisture proof material, such as a resin, a solder resistance material, aluminum nitride, silicon oxide, silicon nitride, silicon oxynitride or other suitable material; but the present disclosure is not limited thereto. The material of the first electrode layer 121 can be different from the material of the second electrode layer 122. The material of the first electrode layer 121 may comprise Al, Cu, Sn or other suitable material. The material of the second electrode layer 122 may comprise Mo, Ti, ITO, IZO, AZO, IGZO or other suitable material. When the second electrode layer 122 is formed on the first electrode layer 121, the second electrode layer 122 can alleviate the oxidation or the corrosion of the first electrode layer 121. However, in another embodiment of the present disclosure, the second electrode layer 122 may not be formed on the first electrode layer 121. Herein, the second electrode layer 122 can be formed by, for example, an electroplating process, an electroless plating process or a vapor deposition process; but the present disclosure is not limited thereto.

As shown in FIG. 1A, in the present embodiment, the insulating layer 13 has a third surface 13a away from the first substrate 1, the first electrode pad 12 has a second surface 12a away from the first substrate 11, and a distance between the third surface 13a and the second surface 12a in the normal direction (Z) of the first surface 11a is defined as a first distance D1. The first distance D can be defined as a maximum distance between the third surface 13a and the second surface 12a in the opening 131 in the normal direction (Z) of the first surface 11a. In other word, viewing from the normal direction (Z) of the first surface 11a, a project of the first electrode pad 12 on the first surface 11a and a project of the opening 131 on the first surface 11a has an overlapping region, a maximum distance in the normal direction (Z) of the first surface 11a between the third surface 13a and the second surface 12a in this overlapping region is defined as the first distance D1. The first distance D1 can be, for example, greater than 0 μm and less than or equal to 14 μm (0 μm<D1≤14 μm). In another embodiment of the present disclosure, the first distance D1 can be, for example, greater than 0 μm and less than or equal to 10 μm (0 μm<D1≤10 μm). The first electrode pad 12 and the insulating layer 13 are disposed on the first surface 11a, and a maximum distance in the normal direction (Z) of the first surface 11a between the third surface 13a and the first surface 11a is defined as a second distance D2. A maximum distance in the normal direction (Z) of the first surface 11a between the second surface 12a of the second electrode layer 122 and the first surface 11a is defined as a third distance D3. In other word, a maximum distance in the normal direction (Z) of the first surface 11a between the first surface 11a and the second surface 12a of the second electrode layer 122 in the opening 131 is defined as the third distance D3. The second distance D2 can be greater than the third distance D3. More specifically, the second surface 12a in the opening 131 may be closed to the third surface 13a, or lower than the third surface 13a; but the present disclosure is not limited thereto.

When the conventional electronic element is going to connect with another electronic element, the conventional electronic element comprises a bump protruding from the surface of the insulating layer, so a height difference is between the bump and the surface of the insulating layer in the normal direction (Z) of the first surface 11a. When the conventional electronic element connects with other substrate by applying a pressure or heat to the electronic element, the height difference may cause the first substrate of the electronic element deformed due to the applied heat; therefore, the electronic element may not contact with the substrate well, resulting in the conductivity of the electronic element reduced. However, as shown in FIG. 1A, in the first electronic element of the present embodiment, the first distance D1 is between the third surface 13a of the insulating layer 13 and the second surface 12a, the second distance D2 is between the third surface 13a and the first surface 11a, and the second distance D2 is greater than the third distance D3 between the second surface 12a and the first surface 11a. Thus, the first electrode pad 12 is not protruded from the third surface 13a of the insulating layer 13. When a pressure or heat is applied onto the first electronic element 1 to connect the first electronic element 1 with a substrate, the possibility of the deforming of the first electronic element 1 can be reduced because the first electrode pad 12 is not protruded from the third surface 13a. Therefore, the stability for connecting the first electronic element 1 with other circuits can be improved, and the quality or lifetime of the obtained device can be increased. The first electronic element 1 of the present embodiment can be applied to, for example, a liquid crystal display device, an inorganic light emitting diode (LED) display device, an organic light emitting diode (OLED) display device, a micro-OLED display device, a mini-LED display device, a micro-LED display device, a quantum-dot light emitting diode (QLED) display device, a tiled display device, a flexible display device, a sensing device or an antenna; but the present disclosure is not limited thereto.

As shown in FIG. 1A, in the first electronic element 1 of the present disclosure, the first electrode pad 12 comprises a first electrode layer 121 and a second electrode layer 122, the first electrode layer 121 is disposed between the first substrate 11 and the second electrode layer 122, and the second electrode layer 122 electrically connects to the first electrode layer 121. In the present embodiment, the second electrode layer 122 can be, for example, directly disposed on, contact or cover the first electrode layer 121. In addition, the second electrode layer 122 has a first thickness T1, which is a maximum thickness of the second electrode layer 122 in the normal direction (Z) of the first surface 11a in a region of the second electrode layer 122 overlapping the opening 131. The first electrode layer 121 has a second thickness T2, which is a maximum thickness of the first electrode layer 121 in the normal direction (Z) of the first surface 11a in a region of the first electrode layer 121 overlapping the opening 131. In some embodiments of the present disclosure, the first thickness T1 may be less than or equal to the second thickness T2. The first electrode layer 121 is an electrode layer for electrically connecting or contacting to the integrated circuit (not shown in the figure) on the first substrate 11. The second electrode layer 122 is used to alleviate the first electrode layer 121 from being corroded by moisture or ambient air before the first electronic element 1 is connects to other circuits, because the corrosion of the first electrode layer 121 may influence the lifetime of the obtained device. Hence, the second electrode layer 122 is disposed on the first electrode layer 121, and the material of the second electrode layer 122 can be a suitable conductive material which may not be easily corroded. In addition, the first thickness T1 of the second electrode layer 122 may be less than or equal to the second thickness T2 of the first electrode layer 121. In one embodiment of the present disclosure, the first thickness T1 may be ranged from 0.5 μm to 1.5 μm (0.5 μm≤T1≤1.5 μm). In another embodiment of the present disclosure, the first thickness T1 may be ranged from 1.0 μm to 1.5 μm (1.0 μm≤T1≤1.5 μm). In one embodiment of the present disclosure, the second thickness T2 may be ranged from 0.5 μm to 1.5 μm (0.5 μm≤T2≤1.5 μm). In another embodiment of the present disclosure, the second thickness T2 may be ranged from 1.0 μm to 1.5 μm (1.0 μm≤T2≤1.5 μm). The first thickness T1 and the second thickness T2 may be modified according to the need, as long as the first distance D1 can be, for example, greater than 0 μm and less than or equal to 14 μm (0 μm<D1≤14 μm).

Figure 1B:
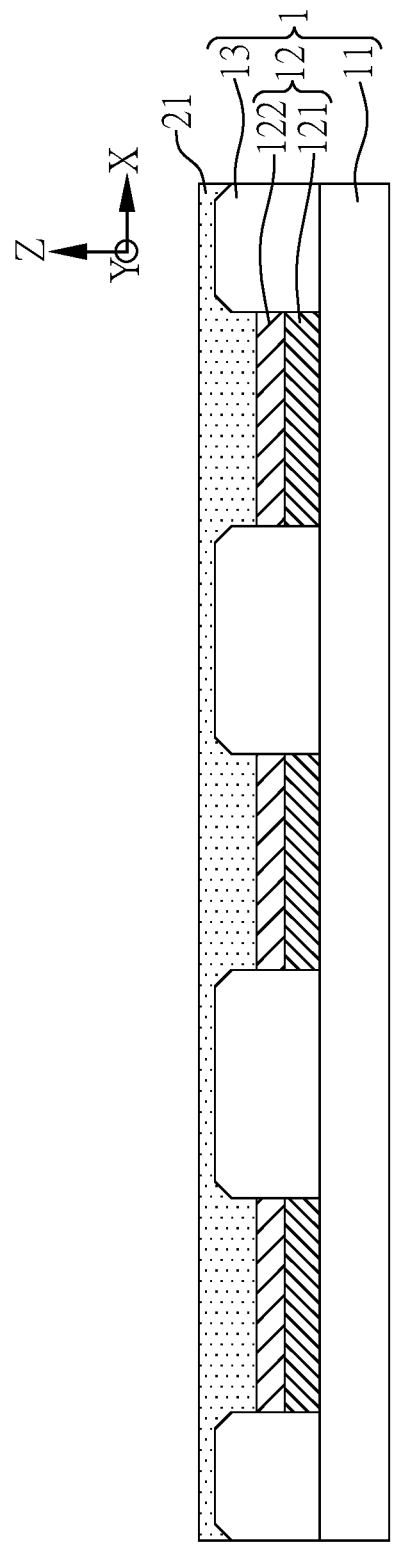
Figure 1C:
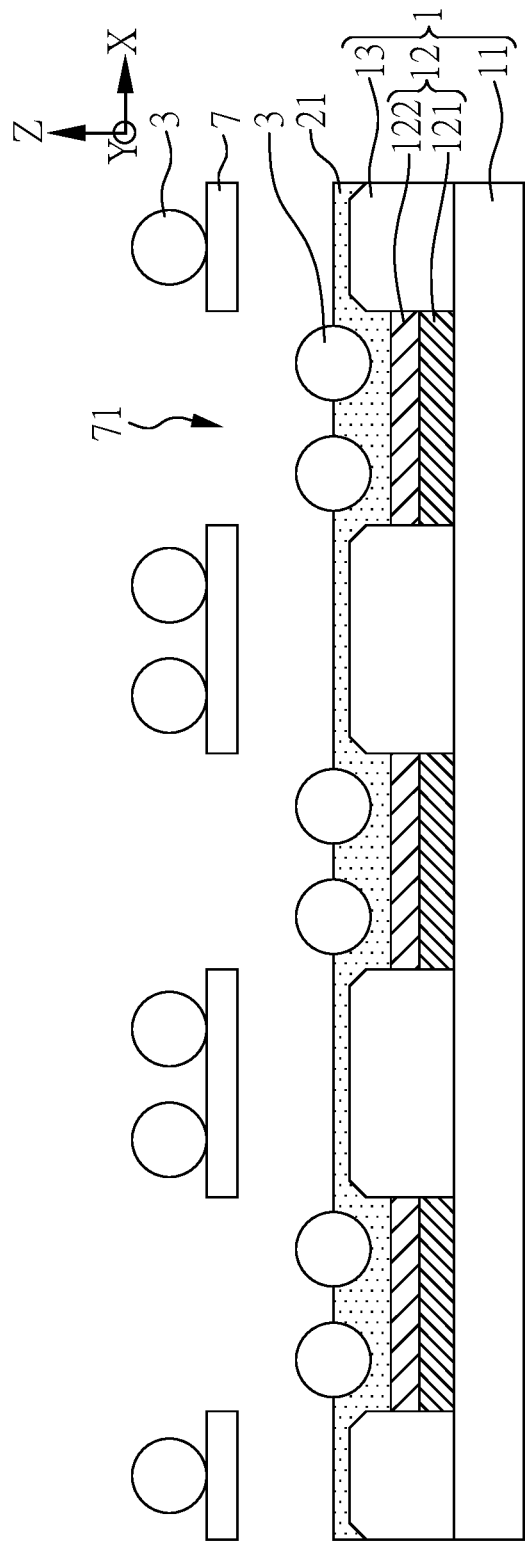
Figure 2C:
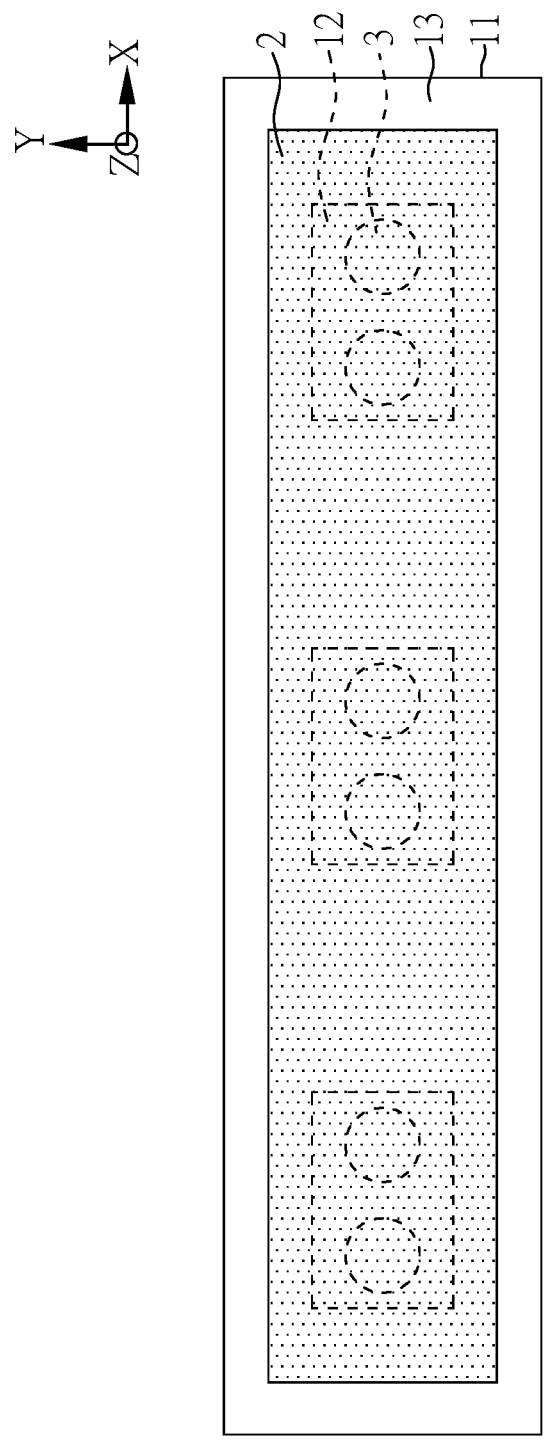
FIG. 2C is a top view of FIG. 1D.

After forming the first electronic element 1 of the present embodiment, as shown in FIG. 1B, a first adhesive layer 21 is disposed on or applied to the first electrode pad 12. In some embodiments, the first adhesive layer 21 contacts and covers the first electrode pad 12, and the first adhesive layer 21 is not solidified completely and showed as a viscous fluid status in this step. Then, as shown in FIG. 1C and FIG. 2B, conductive elements 3 are disposed on the first adhesive layer 21. Herein, a patterned mask 7 comprising at least one hole 71 is used, and the hole 71 is disposed to correspond to the first electrode pad 12. When the patterned mask 7 is used, the conductive elements 3 can be sprayed or disposed on the first adhesive layer 21 on the first electrode pad 12.

Figure 1D:
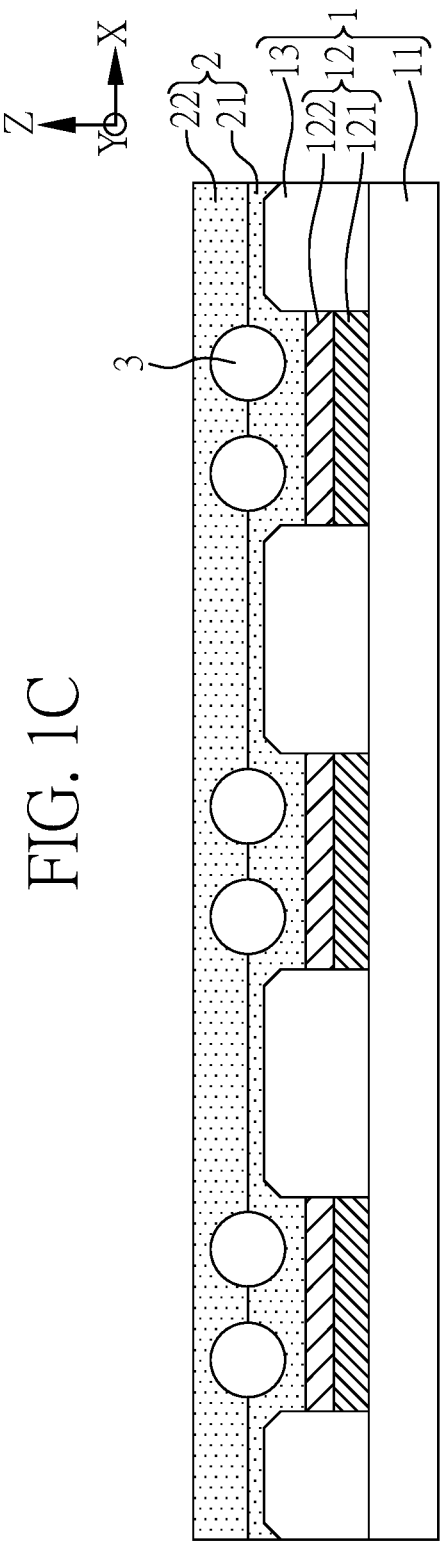

After removing the patterned mask 7, as shown in FIG. 1D, a second adhesive layer 22 can be disposed on or applied to the first adhesive layer 21 and the conductive elements 3, and the first adhesive layer 21 and the second adhesive layer 22 can contact or mix with each other to form an adhesive element 2. In some embodiments, the first adhesive layer 21 and the second adhesive layer 22 can use the same material. In other embodiments, the first adhesive layer 21 and the second adhesive layer 22 can comprise different materials. For example, the first adhesive layer 21 can comprise a material with better adhesive ability to pseudo-fix the conductive elements 3 on the first electrode pad 12 in advance, and the conductive elements 3 can be patterned and disposed. Herein, the adhesive element 2 and the conductive elements 3 can contact each other. Then, as shown in FIG. 1E, a second substrate 41 is disposed oppositely to the first electronic element 1, and the adhesive element 2 is disposed between the second substrate 41 and the first electronic element 1. The second substrate 41 has a fourth surface 41*a*. A second electrode pad 42 is disposed on the fourth surface 41*a*, wherein the second electrode pad 42 has a fifth surface 42*a* away from the second substrate 41, and the fifth surface 42*a* corresponds to and faces to the second surface 12*a* of the first electrode pad 12. When the first electrode pad 12 corresponds to and faces to the second electrode pad 42, the first electrode pad 12 can electrically connect to the second electrode pad 42 via the conductive elements 3 after a lamination process. Herein, a thermal compression bonding or other suitable bonding process can be used to solidify the first adhesive layer 21 and the second adhesive layer 22 to form the adhesive element 2, and to electrically connect the first electrode pad 12 and the second electrode pad 42. The adhesive element 2 is disposed between the first electronic element 1 and the second substrate 41, and the assembling and connection of the first electronic element 1 and the second substrate 41 is completed. Herein, the temperature for the thermal compression bonding process can be, for example, ranged from 100° C. to 200° C.; and the pressure for the thermal compression bonding process can be, for example, ranged from 10 MPa to 120 MPa. However, the present disclosure is not limited thereto.

After the aforesaid process, the electronic device of the present embodiment is obtained. As shown in FIG. 1F, the electronic device of the present embodiment comprises: the aforesaid first electronic element 1; a second electronic element 4; and a conductive element 3. The second electronic element 4 comprises: a second substrate 41 having a fourth surface 41*a*; a second electrode pad 42 disposed on the fourth surface 41*a*, wherein the second electrode pad 42 has a fifth surface 42*a* away from the second substrate 41, and the fifth surface 42*a* corresponds to and faces to the second surface 12*a* of the first electrode pad 12. The conductive element 3 is disposed between the first electrode pad 12 of the first electronic element 1 and the second electrode pad 42, wherein the first electrode pad 12 electrically connects to the second electrode pad 42 via the conductive element 3. In addition, the electronic device of the present embodiment further comprises: an adhesive element 2 disposed between the first electronic element 1 and the second electronic element 4, wherein the adhesive element 2 contacts the conductive element 3.

In the electronic device of the present embodiment, when the first electronic element 1 connects to the second substrate 41 via a thermal compression bonding process, the possibility of the deforming of the first electronic element 1 can be reduced because the first electrode pad 12 is not protruded from the third surface 13*a* of the insulating layer 13, (i.e. the first distance D1 is between the third surface 13*a* of the insulating layer 13 and the second surface 12*a* of the first electrode pad 12, as shown in FIG. 1A). Therefore, the first electronic element 1 can stably contact the second substrate 41, and the yield of the electronic device can be improved. In addition, the conductive element 3 can contact the first electrode pad 12 and/or the second electrode pad 42 well after the thermal compression bonding process by using the conductive element 3 with elasticity and the design of the first distance D1 of the first electronic element 1. More specifically, the conductive element 3 may be compressed, and a ratio of a diameter of the compressed conductive element 3 to a diameter of the original conductive element 3 can be ranged, for example from 0.9 to 0.5 (i.e. the diameter of the compressed conductive element 3/the diameter of the original conductive element 3=0.9~0.5). Contact regions are respectively formed between the conductive element 3 and the first electrode pad 12 and between the conductive element 3 and the second electrode pad 42, and the first electrode pad 12 can electrically connect to the second electrode pad 42 via the conductive element 3.

In the display device of the present embodiment, as shown in FIG. 1F, the adhesive element 2 can be disposed, for example, between the fourth surface 41*a* and the first surface 11*a*; and the adhesive element 2 contacts the third surface 13*a* of the insulating layer 13, the fifth surface 42*a* of the second electrode pad 42, the second surface 12*a* of the first electrode pad 12 and/or the conductive element 3. In addition, the adhesive element 2 may be disposed between the third surface 13*a* and the fourth surface 41*a*. In other embodiments, the adhesive element 2 can be disposed between the second surface 12*a* and the fifth surface 42*a*; in other word, from the normal direction (Z) of the first surface 11*a*, the adhesive element 2 overlaps the first electrode pad 12 and the second electrode pad 42.

In the display device of the present embodiment, the second substrate 41 can be, for example, a flexible circuit board, a rigid circuit board, a display array substrate, or a chip on film (COF); but the present disclosure is not limited thereto. The second substrate 41 can be, for example, a glass substrate, a plastic substrate, a flexible or rigid circuit board, a quartz substrate, a wafer, a sapphire substrate, an organic polymer substrate or a metal substrate. If the second substrate 41 comprises an organic polymer, in one embodiment, the organic polymer can be, for example, polyimide (PI), polyethylene terephthalate (PET), polycarbonate (PC) and etc., but the present disclosure is not limited thereto. The first adhesive layer 21 and the second adhesive layer 22 may respectively comprises a thermosetting polymer material or a thermoplastic polymer material such as an epoxy resin or an acrylic resin; but the present disclosure is not limited thereto. The materials of the first adhesive layer 21 and the second adhesive layer 22 can be different, so the adhesive element 2 may comprises two materials, which can be a combination including acrylic resin, acrylic polyol resin, or other suitable resin material. In other embodiments of the present disclosure, the adhesive element 2 may also be formed by three or more adhesive layers with different materials, so the formed adhesive element 2 may comprise three or more materials. However, the present disclosure is not limited thereto. In addition, the conductive element 3 may comprise, for example, Au, Ni, Pd, Ag, Cu, Sn, other suitable metal, alloy thereof, other suitable conductive material or a composite of organic and inorganic materials coated with a conductive material, or a combination thereof; but the present disclosure is not limited thereto. Furthermore, the diameter of the conductive element 3 can be, for example, ranged from 2.8 µm to 10 µm (2.8 µm≤diameter≤10 µm), but the present disclosure is not limited thereto. Meanwhile, the conductive elements 3 may be arranged by an approximate equal gap in a first direction or a second direction parallel to the first surface 11*a*. For example, as shown in FIG. 1C and FIG. 2B, a long axis of the first electronic element 1 is considered as the first direction (X direction), and a short axis of the first electronic element 1 is considered as the second direction (Y direction), the conductive elements 3 are arranged by an approximate equal gap in the first direction (X direction) and the second direction (Y direction). In other word, the conductive elements 3 are arranged by an equal gap or arranged uniformly when view from the normal direction (Z) of the first surface 11a. However, the present disclosure is not limited thereto.

Embodiment 2

Figure 3C:
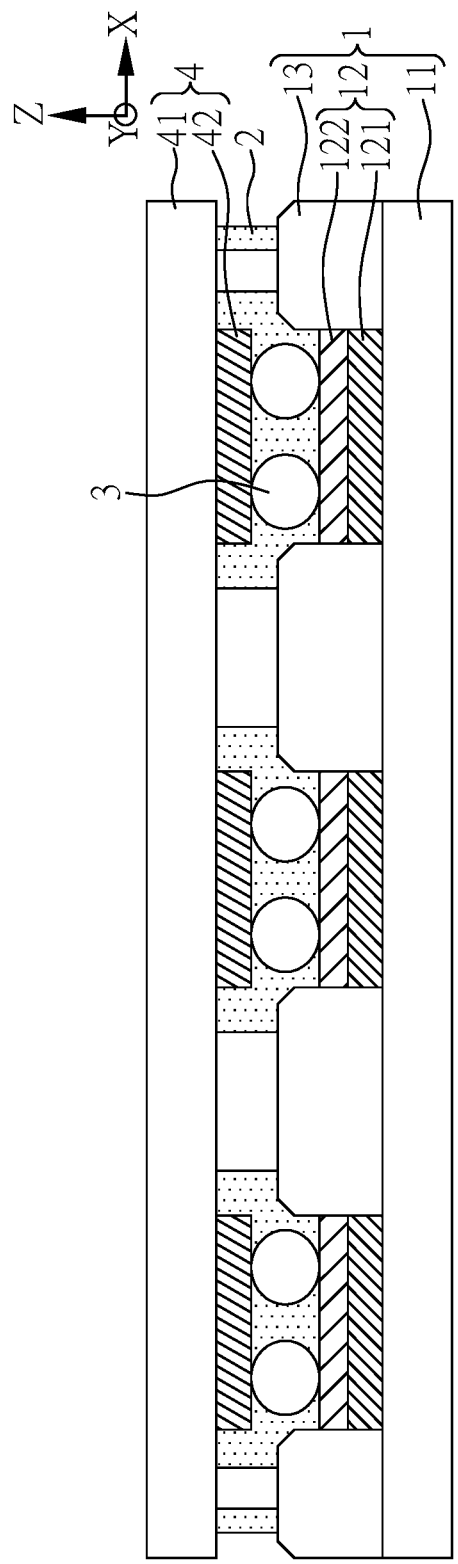
Figure 4:
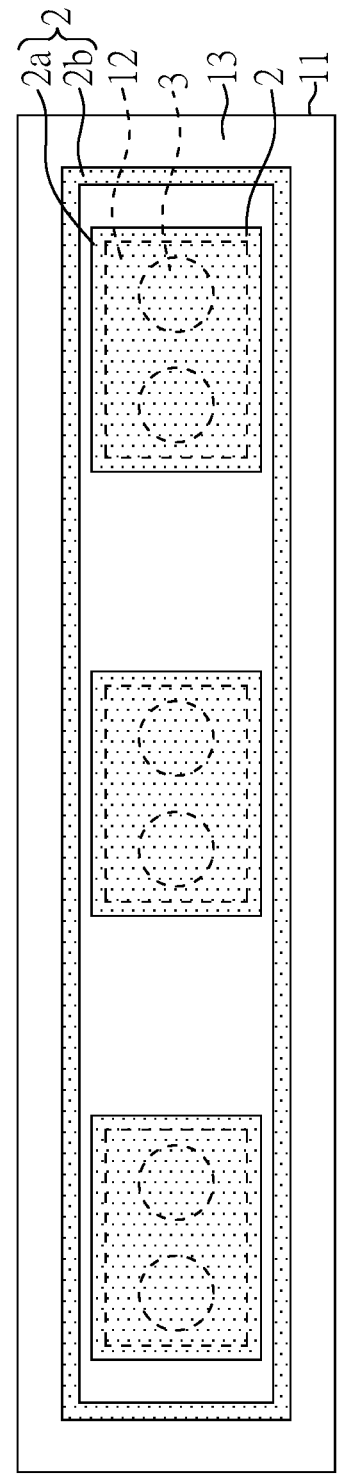
FIG. 4 is a top view of FIG. 3B.

FIG. 3A to FIG. 3C are cross-sectional views showing a process for preparing an electronic device of the present embodiment. FIG. 4 is a top view of FIG. 3B. The structure of the electronic device and the method for manufacturing the same of the present embodiment are similar to those illustrated in Embodiment 1, except for the shape of the adhesive element 2.

In Embodiment 1, as shown in FIG. 1B to FIG. 1E, the first adhesive layer 21 and the second adhesive layer 22 are continuous, so the formed adhesive element 2 is also continuous as shown in FIG. 1F. However, in the present embodiment, as shown in FIG. 3A and FIG. 3B, the first adhesive layer 21 and the second adhesive layer 22 are not continuously formed, so the formed adhesive element 2 is also non-continuous and disposed correspondingly on the first electrode pads 12, as shown in FIG. 3C. As shown in FIG. 3B and FIG. 4, the adhesive element 2 contacts not only the first electrode pads 12, but also a part of the insulating layer 13. Furthermore, the adhesive element 2 may comprise, for example, first regions 2a and a second region 2b, wherein the first regions 2a of the adhesive element 2 are disposed correspondingly on the first electrode pads 12 in the normal direction (Z) of the first surface 11a, and the first regions 2a of the adhesive element 2 may contact the conductive elements 3 corresponding to the first electrode pads 12. The process for disposing the conductive elements 3 to be corresponding to the first electrode pads 12 is similar to that shown in FIG. 1C. The second region 2b of the adhesive element 2 may, for example, be disposed on the first surface 11a and surround the periphery of the first electrode pads 12. Herein, the second region 2b of the adhesive element 2 can have better adhesion strength between the first electronic element 1 and the second substrate 41 (as shown in FIG. 3C). Or, the second region 2b of the adhesive element 2 can block moisture or oxygen, and alleviate the problem that the lifetime of the first electronic element 1 is reduced caused by the moisture or oxygen. FIG. 4 is an example showing the adhesive element 2 including one second region 2b. In other embodiments of the present disclosure, the number of the second region 2b may be greater than one. FIG. 4 is an example showing the outline of the second region 2b being rectangle when viewing from the normal direction (Z) of the first surface 11a. In other embodiment of the present disclosure, the outline of the second region 2b may be, for example, a curve shape, a polygon, or other suitable shapes; and the present disclosure is not limited thereto.

Embodiment 3

Figure 5A:
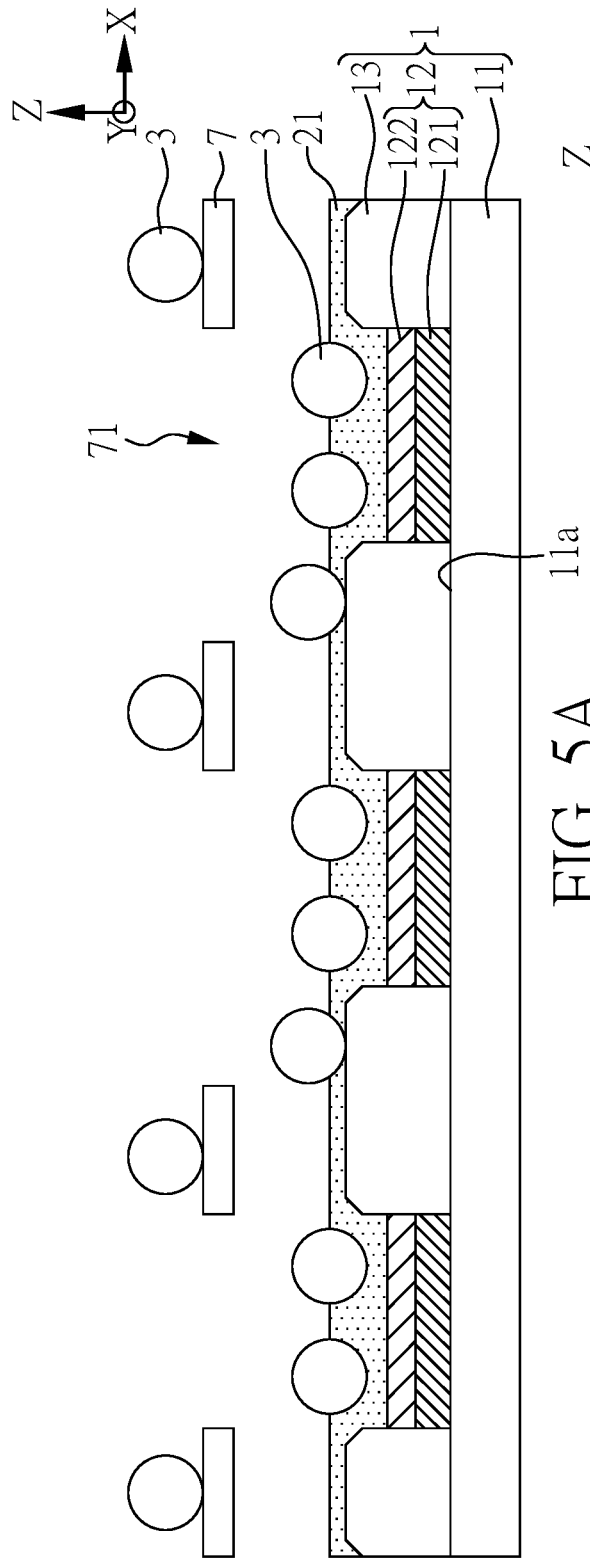
FIG. 5A to FIG. 5C are cross-sectional views showing a process for preparing an electronic device according to Embodiment 3 of the present disclosure.
Figure 5B:
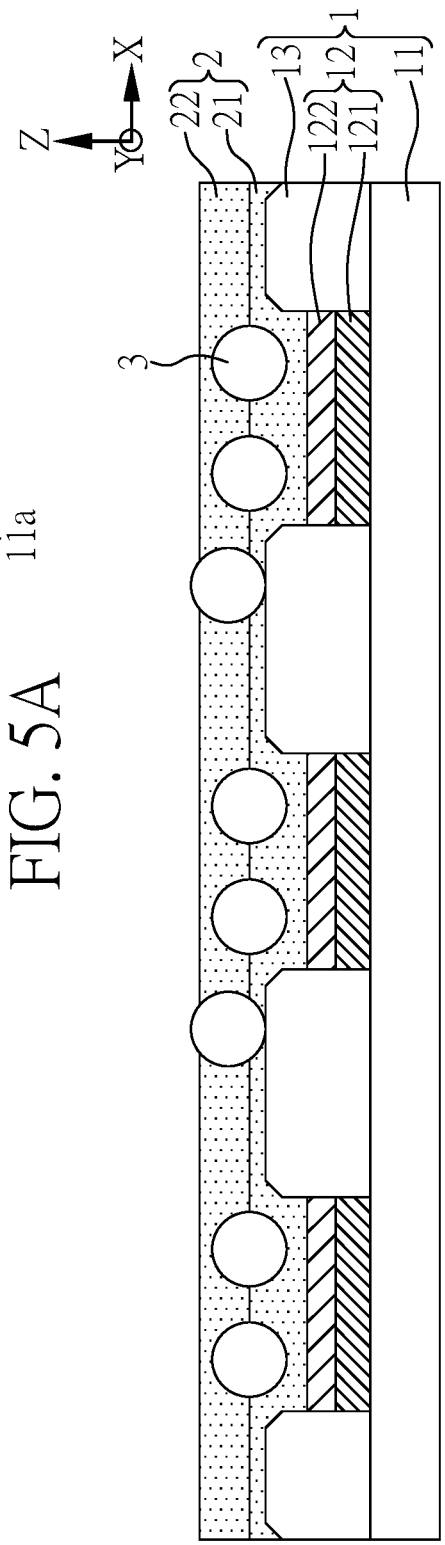
Figure 5C:
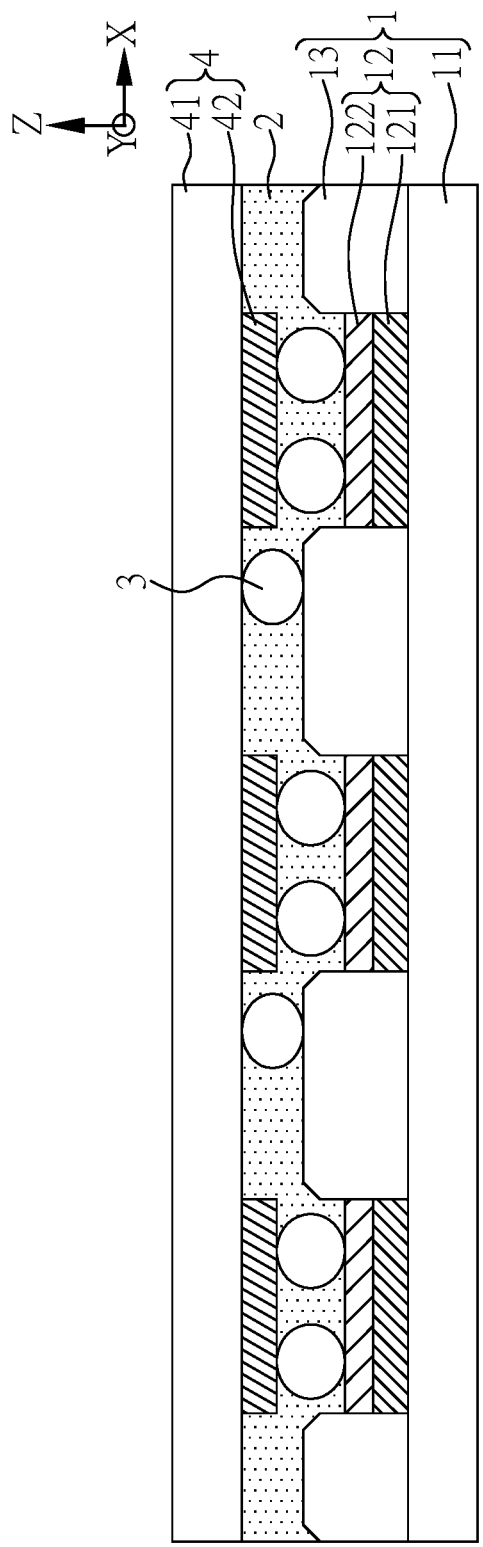
Figure 6:
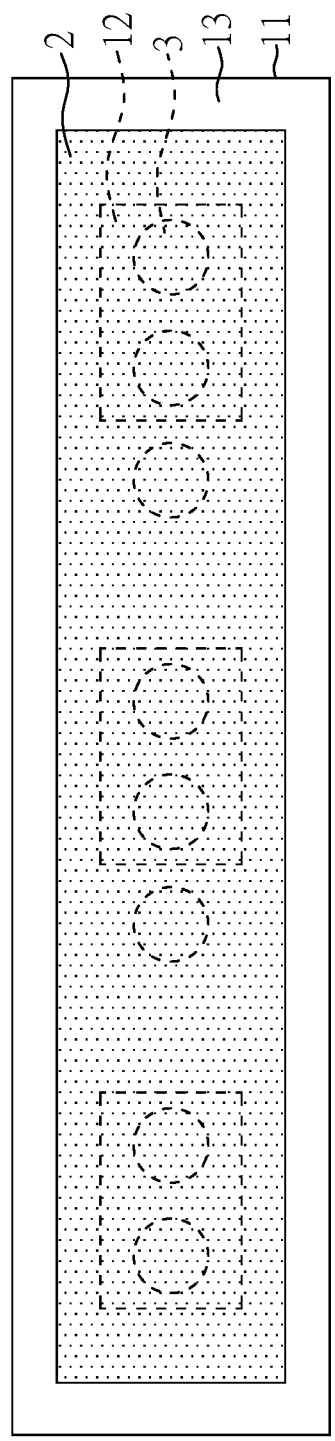
FIG. 6 is a top view of FIG. 5B.

FIG. 5A to FIG. 5C are cross-sectional views showing a process for preparing an electronic device of the present embodiment. FIG. 6 is a top view of FIG. 5B. The structure of the electronic device and the method for manufacturing the same of the present embodiment are similar to those illustrated in Embodiment 1, except for the used patterned mask 7 and the positions of the conductive elements 3.

As shown in FIG. 1C, in Embodiment 1, the holes 71 of the patterned mask 7 are disposed correspondingly to the first electrode pads 12 in the normal direction (Z) of the first surface 11a, so the conductive elements 3 can be disposed or dispersed correspondingly on the first electrode pads 12, as shown in FIG. 1F. However, in the present embodiment, as shown in FIG. 5A, the holes 71 of the patterned mask 7 not only overlap the first electrode pads 12 in the normal direction (Z) of the first surface 11a, but also overlap a part of the insulating layer 13 in the normal direction (Z) of the first surface 11a. In other word, the holes 71 may overlap the first electrode pads 12 and a part of the insulating layer 13 in the normal direction (Z) of the first surface 11a. Hence, as shown in FIG. 5B, FIG. 5C and FIG. 6, when using such patterned mask 7, the conductive elements 3 can be disposed on the first electrode pads 12 and a part of the insulating layer 13. As shown in FIG. 5A to FIG. 6, because only a part of the insulating layer 13 are disposed with the conductive elements 3, the short circuit caused by two adjacent second electrode pads 42 or first electrode pads 12 electrically connecting to each other via conductive elements 3 does not occur after the lamination of the first electronic element 1 and the second substrate 41.

Embodiment 4

Figure 7A:
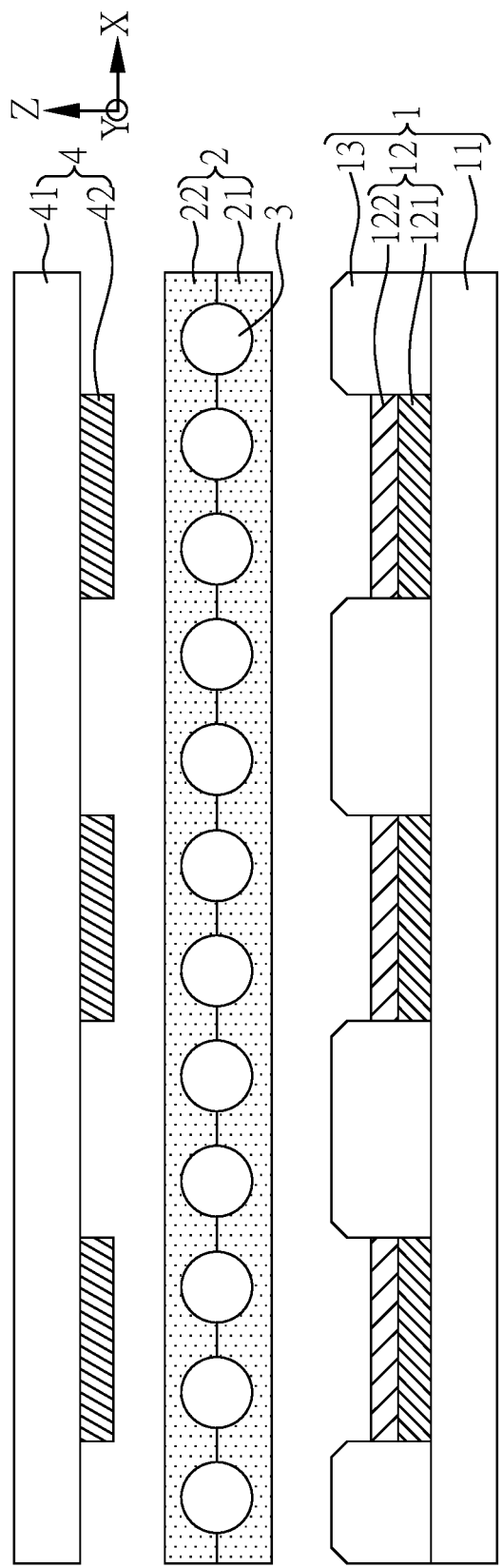
FIG. 7A and FIG. 7B are cross-sectional views showing a process for preparing an electronic device according to Embodiment 4 of the present disclosure.
Figure 7B:
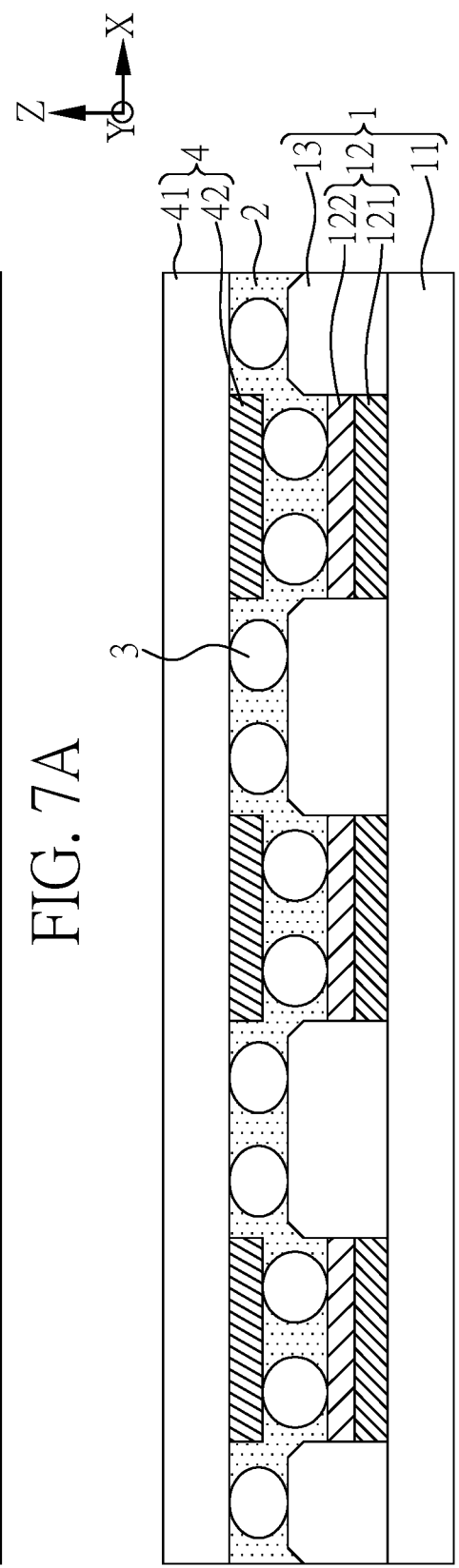

FIG. 7A and FIG. 7B are cross-sectional views showing a process for preparing an electronic device of the present embodiment. The structure of the electronic device and the method for manufacturing the same of the present embodiment are similar to those illustrated in Embodiment 1, except for the method for forming the adhesive element 2 and the conductive elements 3.

In Embodiment 1, as shown in FIG. 1B to FIG. 1D, the first adhesive layer 21 is formed on the first electronic element 1, followed by disposing the conductive elements 3, and then the second adhesive layer 22 is formed. However, in the present embodiment, as shown in FIG. 7A, an adhesive element 2 comprising a first adhesive layer 21, a second adhesive layer 22 and conductive elements 3 is provided. Herein, one of the first adhesive layer 21 and the second adhesive layer 22 has better fluidity, and the other has relative low fluidity. The conductive elements 3 can be, for example, disposed between the first adhesive layer 21 and the second adhesive layer 22 by an approximately equal gap (i.e. in an array). In the present embodiment, most of surfaces of the conductive elements 3 contact the adhesive layer with relative low fluidity. Hence, after the lamination of the first electronic element 1 and the second substrate 41, the relative positions of the conductive elements 3 are not changed a lot. Thus, the conductive elements 3 are still arranged in an array, and the conductive elements 3 can be disposed by an approximately equal gap (i.e. in an array). Therefore, even though conductive elements 3 are disposed on the insulating layer 13, the short circuit does not occur because the conductive elements 3 are not contact to each other. The other adhesive layer with high fluidity may flow during the lamination, so the conductive elements 3 can electrically connect to the first electrode pads 12 and the second electrode pads 42. And, the effect of stable adhesion can be achieved after solidifying the adhesive element 2.

Embodiment 5

FIG. 8 is a cross-sectional view of an electronic device of the present embodiment. The structure of the electronic device the present embodiment is similar to those illustrated in Embodiment 1, except for that the first electrode pads 12 may not comprise the second electrode layer 122 and the electronic device may further comprises a third electrode layer 14.

As shown in FIG. 8, the third electrode layer 14 may be disposed correspondingly on the first electrode pad 12 and electrically connect the first electrode pad 12, and a part of the insulating layer 13 is disposed between the first electrode pad 12 and the third electrode layer 14. In other word, the third electrode layer 14 overlap the second surface 12a and a part of the third surface 13a in the normal direction (Z) of the first surface 11a. Thus, the third electrode layer 14 is disposed not only on the first electrode pad 12 but also on a part of the third surface 13a of the insulating layer 13. In some embodiments, the third electrode layer 14 further contact a part of the third surface 13a. The first electrode pad 12 shown in FIG. 8 may further comprise, for example, the first electrode layer 121. In other embodiment of the present disclosure, the first electrode pad 12 may further comprise a second electrode layer 122. The conductive elements 3 are disposed between the first electrode pad 12 and the second electrode pad 42, and the first electrode pad 12 electrically connect to the conductive elements 3 and the second electrode pad 42 via the third electrode layer 14 disposed on the first electrode pad 12. It should be noted that, in the present embodiment, the first electrode pad 12 overlapping the openings 131 is designed that the first distance D1 in the normal direction (Z) can be, for example, greater than 0 μm and less than or equal to 14 μm (0 μm<D1≤14 μm). In addition, the third electrode layer 14 has a sixth surface 14a away from the substrate 11. A maximum distance is between the third surface 13a and the sixth surface 14a overlapping the openings 131 in the normal direction (Z) of the first surface 11a, and this maximum distance is a fourth distance D4 which can be for example, greater than 0 μm and less than or equal to 13 μm (0 μm<D4≤13 μm). In some embodiments, the first width W1 of the first electrode pad 12 can be almost equal to the second width W2 of the second electrode pad 42, and the first electrode pad 12 approximately overlap the second electrode pad 42 in the normal direction (Z) of the first surface 11a. In other embodiments of the present disclosure, the second width W2 can be smaller than the first width W1, and a part of the second electrode pad 42 may be embedded into the opening 131 and contact the conductive elements 3 after the lamination of the first electronic element 1 and the second substrate 41. However, the present disclosure is not limited thereto, and the relationship between the first width W1 and the second width W2 can be adjusted according to diameters, elasticities, conductivities, types or densities of the conductive elements 3.

Embodiment 6

FIG. 9 is a cross-sectional view of a first electronic element of the present embodiment. The structure of the electronic device the present embodiment is similar to those illustrated in Embodiment 1, except for the following differences. In the present embodiment, the insulating layer 13 may further cover a part of the second surface 12a of the first electrode pad 12. In other word, a part of the insulating layer 13 may overlap the second surface 12a in the normal direction (Z) of the first surface 11a. Herein, a thickness of the insulating layer 13 covering the second surface 12a is approximately equal to a thickness of the insulating layer covering the first surface 11a.

Embodiment 7

FIG. 10 is a cross-sectional view of a first electronic element of the present embodiment. The structure of the electronic device the present embodiment is similar to those illustrated in Embodiment 1, except for that a gap 123 is disposed between the first electrode layer 121 and the insulating layer 13 in the present embodiment, and the second electrode layer 122 is disposed not only on the first electrode layer 121 but also in this gap 123, which means the second electrode layer 122 may contact a part of the first surface 11a of the substrate 11. In other word, a projection area of the second electrode layer 122 on the first surface 11a in the normal direction (Z) of the first surface 11a is greater than a projection area of the first electrode layer 121 on the first surface 11a in the normal direction (Z) of the first surface 11a. Because the second electrode layer 122 covers the first electrode layer 121, the insulating layer 13 only contact the second electrode layer 122 in the present embodiment.

Embodiment 8

FIG. 11 is a cross-sectional view of a first electronic element of the present embodiment. The structure of the electronic device the present embodiment is similar to those illustrated in Embodiment 1, except for that the insulating layer 13 may further cover a part of the second surface 12a of the first electrode pad 12, and a part of the insulating layer 13 may overlap the second surface 12a in the normal direction (Z) of the first surface 11a. Herein, the thickness of the insulating layer 13 covering the first electrode pad 12 is not equal to the thickness of the insulating layer 13 covering the first surface 11a. Since the insulating layer 13 may be disposed after forming the first electrode pad 12, the insulating layer 13 may have different thickness because the forming of the insulating layer 13 does not have to follow the shape of the first electrode pad 12.

Embodiment 9

FIG. 12 is a cross-sectional view of a first electronic element of the present embodiment. The structure of the electronic device the present embodiment is similar to those illustrated in Embodiment 1, except for that a gap 123 is between the insulating layer 13 and the first electrode layer 121 and between the insulating layer 13 and the second electrode layer 122, and the insulating layer 13 does not contact the first electrode layer 121 and the second electrode layer 122. In the present embodiment, the first electrode layer 121 approximately overlaps the second electrode layer 122 in the normal direction (Z) of the first surface 11a, and the first electrode layer 121 and the second electrode layer 122 can be formed by the same process (the same patterning process). However, the present disclosure is not limited thereto.

Embodiment 10

FIG. 13 is a cross-sectional view of a first electronic element of the present embodiment. The structure of the electronic device the present embodiment is similar to those illustrated in Embodiment 1, except for that the second electrode layer 122 is further disposed on a sidewall 13b of the insulating layer 13 but is not disposed on the third surface 13a.

Embodiment 11

FIG. 14 is a cross-sectional view of a first electronic element of the present embodiment. The structure of the electronic device the present embodiment is similar to those illustrated in Embodiment 8, except for that the first electrode pad 12 only comprises one layer, i.e. the first electrode pad 12 only comprises the first electrode layer 121.

In the aforesaid embodiments of the present disclosure, the second electronic element may further comprise a display element 5 disposed on the second substrate 41 and adjacent to the second electrode pad, and the display element electrically connects to the second electrode pad.

Figure 15:
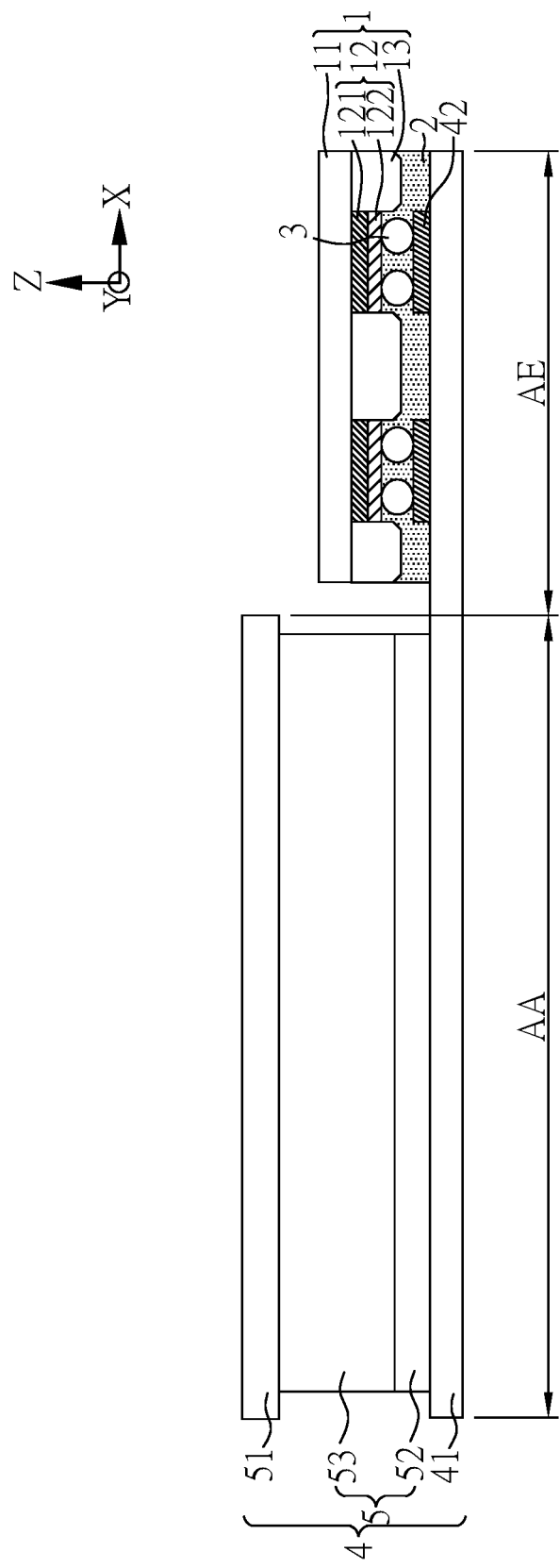
FIG. 15 is cross-sectional view of an electronic device comprising a first electronic element and a second electronic element according to one embodiment of the present disclosure.

FIG. 15 is cross-sectional view of an electronic device comprising a first electronic element and a second electronic element of the present embodiment. The electronic device of the present embodiment is a display device. In the present embodiment, the second electronic element 4 may further comprise a display element 5 disposed on the second substrate 41 and adjacent to the second electrode pad 42. Even though the figure does not show, in other region of the display device of the present embodiment, the display element 5 electrically connects to the second electrode pad 42. More specifically, the second electronic element 4 comprises a display region AA and a border region AE, the display element 5 is disposed on the second substrate 41 and corresponds to the display region AA, the second electrode pad 42 is disposed on the second substrate 41 and corresponds to the border region AE. The display element 5 may comprise a display array 52 and a display medium layer 53, and the display array 52 is disposed between the display medium layer 53 and the second substrate 41. In addition, the second electronic element 4 may further comprise a third substrate 51 disposed oppositely to the second substrate 41, and the display element 5 is disposed between the third substrate 41 and the second substrate 41. The display array 52 may comprise switch transistor (not shown in the figure), scan lines (not shown in the figure), data lines (not shown in the figure) or other elements. The display medium layer 53 may comprise liquid crystals (LCs), quantum dots (QDs), fluorescence molecules, phosphors, organic light-emitting diodes (OLEDs), inorganic light-emitting diodes (LEDs), mini light-emitting diodes (mini-LEDs), micro light-emitting diodes (micro-LEDs), or quantum-dot light-emitting diodes (QLEDs). The third substrate 51 may comprise, but is not limited to, a silicon wafer, a quartz substrate, a glass substrate (silicon dioxide), a sapphire substrate, a plastic substrate, or other suitable substrate. The material of the plastic substrate may comprise, but is not limited to, polyimide (PI), polyethylene terephthalate (PET), polycarbonate (PC), polypropylene (PP), or other plastic material. However, the present disclosure is not limited thereto. FIG. 15 shows an electronic device in which the first electronic element 1 is directly disposed on, laminated on or adhered to the second electronic element 2 (i.e. the display panel), and thus a chip on glass (COG) structure can be obtained; but the present disclosure is not limited thereto. In other embodiments of the present disclosure, the first electronic element 1 may be disposed on, laminated on or adhered to a flexible circuit board, and thus a chip on film (COF) structure can be obtained; but the present disclosure is not limited thereto. In addition, in other embodiments of the present disclosure, if the display medium layer 53 comprises OLEDs, LEDs, mini-LEDs or micro-LEDs, the third substrate 51 can be substituted by an encapsulating layer, a polarizer or other layers.

The electronic elements shown in Embodiment 6 to Embodiment 11 can also be applied to the electronic device illustrated in Embodiment 1 to Embodiment 5. The structure of the electronic device and the method for manufacturing the same are similar to those illustrated in Embodiment 1 to Embodiment 5, and are not repeated again.

In the present disclosure, at least two electronic devices can be arranged in juxtaposition to form a tiled electronic device. The at least two electronic devices can be the same or different, which can be selected from the electronic device made as described in any of the embodiments of the present disclosure as described previously.

The display panel and the display device made as described in any of the embodiments of the present disclosure as described previously can be co-used with a touch panel to form a touch display device. A display device or touch display device may be applied as a flexible or curved display device or touch display device. Meanwhile, a display device or touch display device may be applied to any electronic devices known in the art that need a display screen, such as displays, mobile phones, laptops, video cameras, still cameras, music players, mobile navigators, TV sets, and other electronic devices that display images.

Although the present disclosure has been explained in relation to its embodiment, it is to be understood that any other possible modifications and variations can be made without departing from the spirit and scope of the disclosure as hereinafter claimed.

What is claimed is:

1. A first electronic element, comprising:
   a first substrate having a first surface;
   a first electrode pad disposed on the first surface, wherein the first electrode pad has a second surface away from the first substrate; and
   an insulating layer disposed on the first surface, wherein the insulating layer comprises an opening, the opening is disposed correspondingly to the first electrode pad, and the opening overlaps the first electrode pad in a normal direction of the first surface,
   wherein the insulating layer has a third surface away from the first substrate, a distance between the third surface and the second surface in the normal direction of the first surface is defined as a first distance, and the first distance is greater than 0 μm and less than or equal to 14 μm;
   wherein the first electrode pad comprises a first electrode layer and a second electrode layer, the first electrode layer is disposed between the first substrate and the second electrode layer, and the second electrode layer contacts a part of the first surface of the substrate.

2. The first electronic element of claim 1, wherein the second electrode layer electrically connects to the first electrode layer.

3. The first electronic element of claim 2, wherein a material of the first electrode layer is different from a material of the second electrode layer.

4. The first electronic element of claim 3, wherein the material of the first electrode layer comprises Al, Cu or Sn.

5. The first electronic element of claim 3, wherein the material of the second electrode layer comprises Mo, Ti, ITO, IZO, AZO or IGZO.

6. The first electronic element of claim 1, wherein the second electrode layer has a first thickness, the first electrode layer has a second thickness, and the first thickness is less than or equal to the second thickness.

7. The first electronic element of claim 1, further comprising a third electrode layer, wherein the third electrode layer is disposed correspondingly to the first electrode pad and electrically connects to the first electrode pad, and a part of the insulating layer is disposed between the first electrode pad and the third electrode layer.

8. The first electronic element of claim 1, wherein a distance between the third surface and the first surface in the normal direction of the first surface is defined as a second distance, a distance between the second surface and the first surface in the normal direction of the first surface is defined as a third distance, and the second distance is greater than the third distance.

9. An electronic device, comprising:
a first electronic element, comprising:
a first substrate having a first surface;
a first electrode pad disposed on the first surface, wherein the first electrode pad has a second surface away from the first substrate; and
an insulating layer disposed on the first surface, wherein the insulating layer comprises an opening, the opening is disposed correspondingly to the first electrode pad, and the opening overlaps the first electrode pad in a normal direction of the first surface, wherein the insulating layer has a third surface away from the first substrate, a distance between the third surface and the second surface in the normal direction of the first surface is defined as a first distance, and the first distance is greater than 0 μm and less than or equal to 14 μm;
a second electronic element, comprising:
a second substrate having a fourth surface; and
a second electrode pad disposed on the fourth surface, wherein the second electrode pad has a fifth surface away from the second substrate, and the fifth surface corresponds to and faces to the second surface of the first electrode pad; and
a conductive element disposed between the first electrode pad and the second electrode pad, wherein the first electrode pad electrically connects to the second electrode pad via the conductive element, and at least part of the conductive element is disposed in the opening;
wherein the first distance is greater than or equal to a diameter of the conductive element.

10. The electronic device of claim 9, wherein the first electrode pad comprises a first electrode layer and a second electrode layer, the first electrode layer is disposed between the first substrate and the second electrode layer, and the second electrode layer electrically connects to the first electrode layer.

11. The electronic device of claim 10, wherein a material of the first electrode layer is different from a material of the second electrode layer.

12. The electronic device of claim 11, wherein the material of the first electrode layer comprises Al, Cu or Sn.

13. The electronic device of claim 11, wherein the material of the second electrode layer comprises Mo, Ti, ITO, IZO, AZO or IGZO.

14. The electronic device of claim 10, wherein the second electrode layer has a first thickness, the first electrode layer has a second thickness, and the first thickness is less than or equal to the second thickness.

15. The electronic device of claim 9, wherein the first electronic element further comprises a third electrode layer, the third electrode layer is disposed correspondingly to the first electrode pad and electrically connects to the first electrode pad, and a part of the insulating layer is disposed between the first electrode pad and the third electrode layer.

16. The electronic device of claim 9, wherein a distance between the third surface and the first surface in the normal direction of the first surface is defined as a second distance, a distance between the second surface and the first surface in the normal direction of the first surface is defined as a third distance, and the second distance is greater than the third distance.

17. The electronic device of claim 9, further comprising an adhesive element disposed between the first electronic element and the second electronic element, wherein the adhesive element contacts the conductive element.

18. The electronic device of claim 17, wherein the adhesive element is disposed between the third surface and the fourth surface.

19. The electronic device of claim 17, wherein the adhesive element comprises at least two materials.

20. The electronic device of claim 9, wherein the second electronic element further comprises a display element disposed on the second substrate and adjacent to the second electrode pad, and the display element electrically connects to the second electrode pad.

* * * * *